United States Patent [19]

Feuerstein et al.

[11] Patent Number: 4,530,100
[45] Date of Patent: Jul. 16, 1985

[54] VAPORIZER CRUCIBLE FOR VACUUM VAPOR-DEPOSITION

[75] Inventors: Albert Feuerstein, Nidderau; Klaus-Jürgen Heimbach, Hattersheim; Helmut Warscheit, Rodgau, all of Fed. Rep. of Germany

[73] Assignee: Leybold-Heraeus GmbH, Cologne, Fed. Rep. of Germany

[21] Appl. No.: 511,862

[22] Filed: Jul. 7, 1983

[30] Foreign Application Priority Data

Jul. 29, 1982 [DE] Fed. Rep. of Germany ....... 3228311

[51] Int. Cl.³ .......................................... H01J 37/305
[52] U.S. Cl. ............................... 373/11; 219/121 EL; 373/10
[58] Field of Search ....................................... 373/11–16; 219/121 EE, 121 EB, 121 EF, 121 EG, 121 EL

[56] References Cited

U.S. PATENT DOCUMENTS 3,360,600  12/1967  DuBois ................................. 373/10
3,414,655  12/1968  Allen ................................... 373/11

Primary Examiner—A. D. Pellinen
Assistant Examiner—Gregory D. Thompson
Attorney, Agent, or Firm—Max Fogiel

[57] ABSTRACT

A vaporizer crucible for vacuum vapor-deposition apparatus, comprises a metallic body 1 having a recess 2 for accommodating vaporizing material and connected in a thermally-conductive manner to a cooling duct 7 which surrounds the recess 2 at least partially. For effectively preventing reduction in heat transfer in the event of the formation of vapor bubbles in the cooling medium at least one guide device 22 for imparting a swirling motion to the cooling medium flowing in the cooling duct 7 is provided in said duct. The guide device 22 preferably takes the form of a spiral element matching the path of the cooling duct.

9 Claims, 6 Drawing Figures

VAPORIZER CRUCIBLE FOR VACUUM VAPOR-DEPOSITION

BACKGROUND OF THE INVENTION

The invention concerns a vaporizer crucible for vacuum vapour-deposition apparatus installations and comprising a metallic body which has a recess for accommodating vaporizing material and connected in a thermally-conductive manner to a cooling duct which surrounds the recess at least partially.

Vaporizer crucibles of the above kind are disclosed in, for example, DE-PS No. 12 62 101. Therein, the cooling duct is formed between an inner wall and an outer wall, but the flow of cooling medium is left more or less to chance, i.e., the stream of cooling medium follows the path of least resistance.

Fluid-cooled vaporizer crucibles of this kind are generally used for apparatus in which the vaporization material is heated directly, by electron bombardment for example, since direct heating through the wall of the crucible is precluded because of the cooling of the fluid. Electron bombardment is generally carried out from above, so that because of the danger of electrons impinging upon it the upper edge of the crucible is, in fact, the critical part of the crucible that has to be cooled in a particularly intensive manner. With the known double-walled crucible, very considerable rates of flow and therefore high consumption of coolant e.g. water are required in order to ensure adequate and reliable cooling.

Vaporizer crucibles for electron beam heating are also known which consist of a substantially solid block of metal (copper) having high thermal conductivity, in which block is provided a cooling duct which surrounds the recess and is of roughly constant cross-section. A cooling duct of this kind is formed by, for example, a plurality of drilled holes of like diameter which are disposed at right angles to each other; the drilled holes communicate with each other and, apart from two connection openings, are closed off from the exterior by means of plugs. The flow in cooling ducts of this kind must follow the path of the duct system, i.e. short-circuiting of the flow is precluded. However, a further problem remains, namely the formation of vapour bubbles that occur during the heavy loading of the crucible by the electron bombardment.

In the cooling of vessels comprising cylindrical or conical recesses for accommodating vaporization material, at least one cooling duct is expediently provided concentrically to the recess. When cooling medium flows through this duct, the centrifugal force which develops results in force being applied to the coolant in the direction towards the outer periphery of the cooling duct. If the cooling medium contains constituents, such as the above-described vapour bubbles, that have a lower specific weight than that of the cooling medium, these constituents are displaced toward the inner wall of the annular cooling duct (centrifugal effect). In the case of cooling circuits wherein the heat transferred per unit surface is great and in which what is called "bubble vaporization" occurs, this effect can drastically reduce the heat transfer at the inside, i.e. calculated at a zone where the greatest thermal loading of the material of the crucible takes place.

However, even with cooling ducts which are formed by a system of rectilinear drilled holes, any vapour bubbles that may be formed rise, under the effect of the force of gravity, to the line of the cylinder constituted by each drilled hole, and in this zone they drastically reduce heat transfer. Heavy thermal loading occurs also in this zone, particularly when electrons impinge upon the upper edge of the crucible.

In practice, depending upon the path of the cooling duct a resultant between centrifugal force and force of gravity is then established and, particularly with crucibles having a conical recess, this leads to disadvantages, since the danger of tapered crucible walls being acted upon by electrons increases as the quantity of vaporization material diminishes. Crucibles having conical recesses are desirable, however, since under the effects of electron bombardment, the vapour stream spreads upwardly, roughly in the form of a club, and as far as possible it should not be allowed to come into contact with the edge of the crucible, so as to avoid shading effects.

SUMMARY OF THE INVENTION

The object of the present invention is, therefore, to prevent in an effective manner, reduction of heat transfer in the event of the formation of vapour bubbles in the initially described vaporizer crucible.

According to the invention, this object is achieved with a vaporizer crucible for vacuum vapour-deposition apparatus, comprising a metallic body having a recess for accommodating vaporizing material and connected in a thermally-conductive manner to a cooling duct which surrounds the recess at least partially, and at least one guide device provided in the cooling duct for imparting a swirling motion to cooling medium flowing in the cooling duct.

This swirling motion involves superposing a rotational motion on the flow of cooling medium about the longitudinal axis of the cooling duct. This longitudinal axis may be rectilinear or curved; it is preferably circular and, in fact, concentric with the recess in the metallic body. In other words, the elements constituting the volume of the cooling medium execute an additional and very much more rapid rotational motion about the axis of the cooling duct during their travel around the recess, so that, under the effect of centrifugal force, the vapour bubbles of lower specific weight are forced in the direction toward the longitudinal axis of the cooling duct, while the wall of the cooling duct rmains wetted by the cooling medium (water) of greater specific weight. In this way, a suction action, as it were, is applied to the vapour bubbles, and this action removes them from the inner wall, which may have become overheated, so that effective cooling is maintained. This results in an improvement in the cooling effect, in more economical use of the cooling fluid (saving in water) and in an extension in the service life of the crucible cooled in this manner.

It will be understood that the centrifugal force produced by the swirling motion should be greater than the centrifugal force caused by movement around the recess. By means of a suitable pitch of the guide device which, in the zone of the wall of the cooling duct, is advantageously between 20° and 60° to the axis of the cooling duct, an adequately vigorous swirling motion is however produced in conjunction with the establishment of a sufficiently strong flow of cooling medium, and this swirling motion forces any vapour bubbles that may be formed into the centre of the cooling duct.

In this arrangement, it is not essential that the guide device should extend over the entire length of the cooling duct; instead, it is also possible to provide a plurality of spaced guide devices along the path of the cooling duct, but the spaces must be sufficiently small to ensure that the swirling motion is substantially maintained.

The guide device that is used may be any three-dimensional body which imparts a tangential impulse to the initially axial flow. In the simplest case, use could be made of areal elements, set obliquely in relation to the directon of flow, such as are constituted by, for example, stationary propellers and other twisted bodies. In this connection, it is particularly advantageous and, in addition, particularly simple as regards effecting the necessary attachment if the guide device or devices is or are in the form of a spiral element or elements matching the path along which the cooling duct extends. In this way, a substantially low-loss continuous flow having a constant swirling motion is achieved, such flow representing the optimum for obtaining effective cooling.

In the matter of the manufacture of the vaporizer crucible and as regards the fitting of the guide device, it is particularly advantageous if (a) the metallic body surrounding the recess comprises a flange and a dished portion connected to the flange, (b) the cooling duct is a circular channel machined in the metallic body, and (c) the metallic body is inserted into a lower part of the crucible and so closes off the circular channel.

With a view to achieving particularly intensive cooling of the lower part of the dish, it is also particularly expedient if (d) a further annular cavity is enclosed between the metallic body and the lower part of the crucible, which cavity surrounds the lower end of the dished portion and has a diametral partition, at one side of which is arranged the cooling medium supply pipe and on the other side of which is arranged the cooling medium discharge pipe, (e) at that side of the further cavity that is remote from the cooling medium supply and discharge pipes, said cavity· is connected, by uptake ducts associated respectively with said pipes, to the overlying cooling duct, and (f) the cooling duct is closed off by a further partition between the uptake ducts.

The effect of this arrangement is that the cooling medium first enters at the lower zone of the crucible, passes along the lower face of the dish in a direction substantially parallel to the partition, from there enters, by way of one of the uptake ducts, the overlying cooling duct incorporating a guide device, than passes round the upper portion of the recess in the reverse direction while at the same time executing the above-described swirling motion, thereafter passes to the other side of the partition which is not present in the upper part, flows downwardly again through the other uptake duct and—again in the opposite direction—passes through the opposite half of the cavity in a direction substantially parallel to the partition and finally leaves the crucible through the cooling medium discharge pipe. In this way, an extremely effective flow of cooling medium without short-circuiting is achieved over the entire surface of the crucible recess, and at the same time the risk of formation of vapour bubbles with heavy thermal loading of the crucible is eliminated in the particularly endangered upper zone.

BRIEF DESCRIPTION OF THE DRAWINGS

An embodiment of the invention will now be described in greater detail with reference to the accompanying drawings, in which.

DETAILED DESCRIPTION OF THE INVENTION

Figure 4:
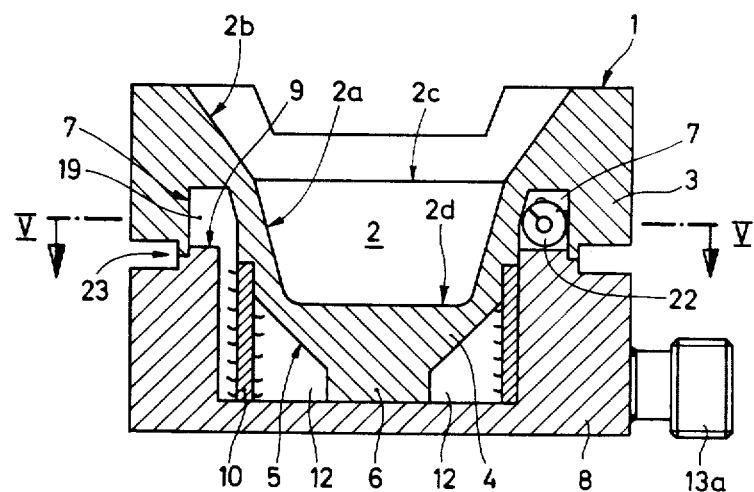
FIG. 4 is a vertical section through the crucible along the line IV—IV in FIG. 3.

FIGS. 1 to 5 show a vaporizer crucible which comprises a metallic body 1 having a recess 2 for accommodating vaporization material. The metallic body 1 has a flange 3 and a dished portion 4 which is integral with the flange and is delimited at the bottom by a conical surface 5 and a cylindrical extension 6 (FIG. 4).

Figure 1:
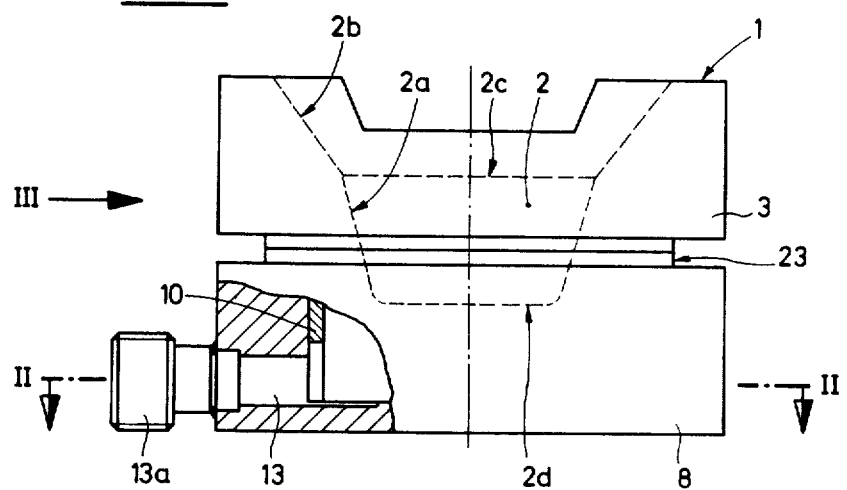
FIG. 1 is a side view of the vaporizer crucible.

The recess 2 is formed by the two faces 2a and 2b which widen upwardly and join each other at a point 2c where their diameters are equal to each other. The lower delimiting face of the recess 2 is a horizontal round face 2d (FIGS. 1 and 4).

The recess 2 is surrounded by a cooling duct 7 in the shape of an axially extending circumferential groove formed in the metallic body 1. As shown in FIG. 4, the metallic body 1 is inserted in a lower part 8 of the crucible to close off the circumferential groove, and the upper delimiting face 9 of said lower part forms the fourth wall delimiting the cooling duct 7. The metallic body 1 may also be referred to as the upper part of the crucible.

Figure 2:
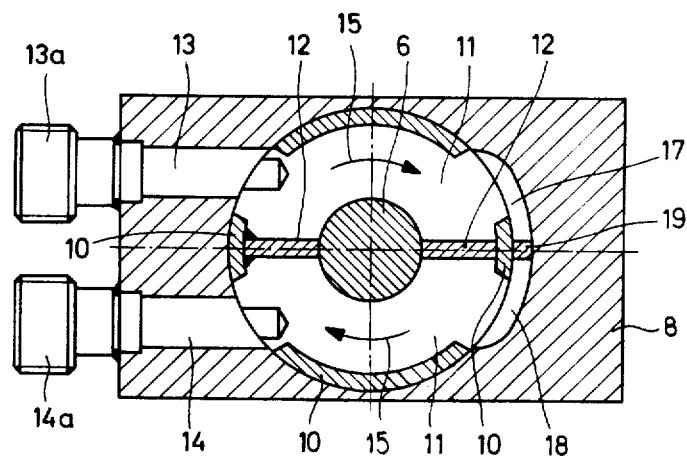
FIG. 2 is a horizontal section through the crucible along the line II—II in FIG. 1.
Figure 3:
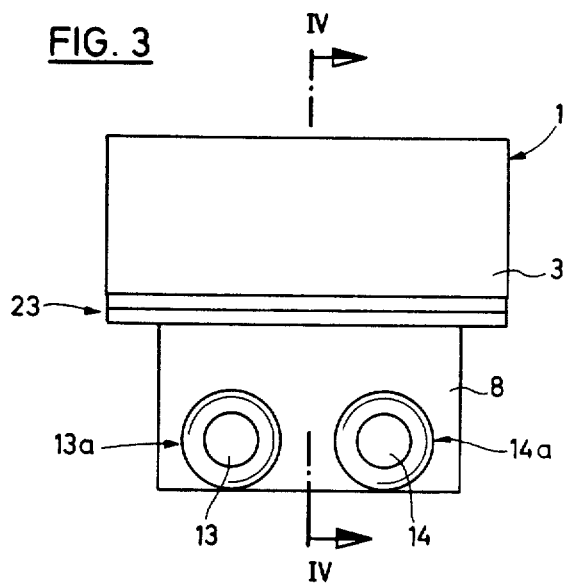
FIG. 3 is a front view of the vaporizer crucible seen in the direction indicated by the arrow III in FIG. 1.

In the zone of the conical face 5 and the cylindrical extension 6, the dish 4 is surrounded by a hollow cylinder 10 having corresponding cut-away portions as shown in FIG. 2. In this way a further annular cavity 11 is formed between the metallic body 1 and the lower part 8 of the crucible in the zone of the lower face of the dish 4, which cavity 11 is divided in a mirror-image manner by a partition 12. The partition 12 consists of two parts arranged one at each side of the cylindrical extension 6 (FIGS. 2 and 4).

It can be seen, particularly from FIG. 2, that a cooling medium supply pipe 13 is arranged at one side of the partition 12 and a cooling medium discharge pipe 14 at the other side of this partition. Connection to external pipes can be achieved by means of screw-threaded nipples 13a and 14a. In this way, flow in opposite directions as indicated by the two arrows 15 and 16 can be set up in the cavity 11, but reversal of flow in the cavity 11 is prevented by the partition 12. At the side remote from the connections, uptake ducts 17, 18 are provided and connect the two halves of the cavity 11 to the overlying cooling duct 7. The two uptake ducts 17 and 18 are located at the left-hand side in FIG. 4 and they run parallel to each other; however, short-circuiting of flow at this point is prevented by a further partition 19. This partition is seen only in plan view in FIG. 4, while in FIGS. 2 and 5 it is illustrated in section.

The partition 19 also projects inwardly into the cooling duct 7 and seals off to prevent short-circuiting of flow. The stream of cooling medium passing upwardly into the cooling duct 7 through the uptake duct 17 moves to the left in FIG. 5, starting from the partition 19, and flows round the recess 2 in the direction indicated by the two arrows 20 and 21. Comparison of FIGS. 2 and 5 will show that flow takes place in opposite directions in the cavity 11 and in the overlying cooling duct 7, this being clearly indicated by the directions in which the arrows 15/20 and 16/21 point.

Figure 5:
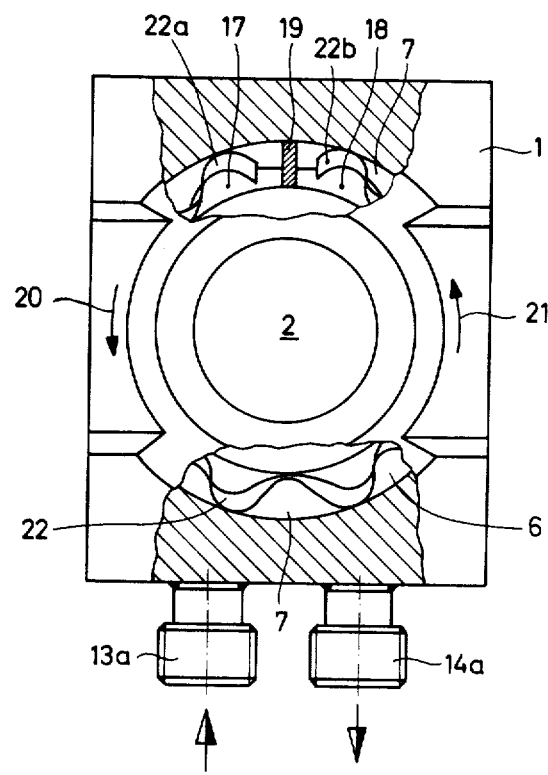
FIG. 5 is a plan view which includes a sectional view through the upper cooling duct along the line V—V of FIG. 4.

Located in the cooling duct 7 is a guide device 22 having two ends 22a and 22b which are disposed one at each side of the partition 19 (FIG. 5). It will be seen that the guide device 22 extends over the entire length of the cooling duct 7 and takes the form of a spiral element, the outer enveloping surface of which can be designated a toroidal surface. By means of this guide device, a swirling motion can be superposed on the flow of cooling medium, the direction of which is indicated by the arrows 20/21, the speed of revolution of this swirling motion being a multiple of the speed of flow around the recess 2. In this way and as stated above, the fluid of considerably greater specific weight is constantly displaced into the zone of the edge of the cooling duct 7, whereas the lighter vapour bubbles move along the axis or centre-line of the cooling duct 7 and are carried out of the vaporizer crucible in the stream of cooling medium, or are condensed.

It should also be mentioned that the metallic body 1 (upper part of the crucible) and the lower part 8 of the crucible are inseparably interconnected at their interfaces 23 by electron-beam welding which is noted for causing only extremely low stresses in the material.

Figure 6:
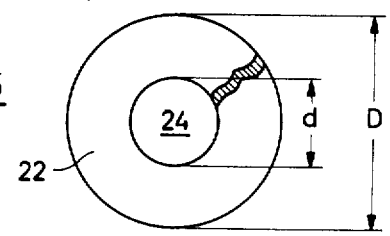
FIG. 6 is a radial section through the guide device.

The radial section through the guide device 22, shown in FIG. 6, is in principle a projection on to a plane at right angles to the longitudinal axis of the cooling duct 7 (or of the guide device 22). It will be seen that the guide device, in the form of a spiral element, has an open cross-section 24 in the zone of its longitudinal axis. The diameter d of this cross-section 24 should be as great as possible so as to afford, as far as possible, unrestricted passage to the stream of cooling medium, particularly as it has to be borne in mind that any vapour bubbles that may be entrained in the middle of the stream of cooling medium should, as far as possible, encounter no impediment to their flow. The turns of the guide device 22, which are roughly rectangular in cross-section, therefore pass between an inner torus and an outer torus, coaxial therewith, in the case of a circular cooling duct 7, as shown in FIG. 5. Experience has shown that, in the simplest case, a helically coiled wire is quite satisfactory for imparting sufficient swirling motion to the otherwise axially directed stream of cooling medium.

The spiral element has an open cross-section having a diameter at least 25% of the outside diameter of the spiral element.

We claim:

1. A vaporizer crucible for vacuum vapor deposition apparatus, comprising: a metallic body having a recess accommodating vaporizing material; a cooling duct surrounding said recess at least partially and connected thermally-conductively to said metallic body; and guide means in said cooling duct imparting a swirling motion to cooling medium flowing in said cooling duct; said metallic body surrounding said recess comprising a flange and a dished portion connected to said flange; said cooling duct comprising a circular channel machined in the metallic body; said metallic body being inserted into a lower part of the crucible and closing off the circular channel.

2. A vaporizer crucible according to claim 1, and an annular cavity enclosed between said metallic body and lower part of the crucible, said cavity surrounding a lower end of said dished portion and having a diametral partition; a cooling medium supply pipe arranged on one side of said diametral partition; and a cooling medium discharge pipe arranged on another side of said diametral partition; said cavity being connected by uptake ducts, associated respectively with said pipes, to the overlying cooling duct at a side of said cavity remote from said cooling medium supply and discharge pipes; and a further partition between said uptake ducts closing off said cooling duct.

3. A vaporizer crucible for vacuum vapor deposition apparatus, comprising: a metallic body having a recess accommodating vaporizing material; a cooling duct surrounding said recess at least partially and connected thermally-conductively to said metallic body; and guide means in said cooling duct imparting a swirling motion to cooling medium flowing in said cooling duct; said guide means comprising substantially spiral means matching the path of said cooling duct; said spiral means having an open cross-section in a zone of its longitudinal axis, said cross-section having a diameter at least 25% of the outside diameter of said spiral means.

4. A vaporizer crucible according to claim 3, wherein said guide means comprises a helically coiled wire.

5. A vaporizer crucible for vacuum vapor deposition apparatus, comprising: a metallic body having a recess accommodating vaporizing material; a cooling duct surrounding said recess at least partially and connected thermally-conductively to said metallic body; and guide means in said cooling duct imparting a swirling motion to cooling medium flowing in said cooling duct; said metallic body having a flange and a dished portion integral with said flange, said dished portion being delimited at its bottom by a conical surface and a cylindrical extension, said recess being formed by two faces widening upwardly and joining each other at a point where their diameters are equal, said recess having a lower delimiting face comprised of a horizontal round face, said cooling duct comprising an axially extending circumferential groove formed in said metallic body, said metallic body being inserted in a lower part of the crucible for closing off said circumferential groove, said lower part having an upper delimiting face forming a wall which delimits the cooling duct, said dish being surrounded by a hollow cylinder having corresponding cut-away portions in a zone of said conical face and said cylindrical extension, an annular cavity formed between said metallic body and said lower part of the crucible in a zone of the lower face of said dish, said cavity being divided by a partition comprised of two parts arranged one at each side of said cylindrical extension, a cooling medium supply pipe arranged at one side of said partition, a cooling medium discharge pipe arranged at the other side of said partition, said cavity having flows in opposite directions, reversal of flow in said cavity being prevented by said partition, uptake ducts connecting two halves of said cavity to said cooling duct, a further partition for preventing short-circuiting of flow and projecting inwardly into said cooling duct, cooling medium passing upwardly into said cooling duct through one of said uptake ducts starting from said further partition and flowing about said recess in opposite directions in said cavity and in said cooling duct, said guide means having two ends located on each side of said further partition, said guide means extending over substantially the entire length of said cooling duct and having a spiral shape with an enveloping surface comprising substantially a toroidal surface, said swirling motion having a rotational speed which is substantially a multiple of the speed of flow about said recess, substantially lighter vapor bubbles moving along an axis of said cooling duct and being carried out of said vaporizer crucible in a stream of cooling medium, said guide means having an open cross-section in a zone of its longitudinal axis.

6. A vaporizer crucible for vacuum vapor deposition apparatus, comprising: a metallic body having a recess accommodating vaporizing material; a cooling duct surrounding said recess at least partially and connected thermally-conductively to said metallic body; and guide means in said cooling duct imparting a swirling motion to cooling medium flowing in said cooling duct; said swirling motion being substantially non-turbulent and having a centrifugal effect forcing relatively light vapor bubbles toward a center of the swirling motion and forcing relatively heavy substantially cold fluid parts toward an outer periphery of said swirling motion, said swirling motion being superposed on flow of said cooling medium about a longitudinal axis of said cooling duct.

7. A vaporizer crucible according to claim 6, wherein said guide means comprises substantially spiral means matching the path of said cooling duct.

8. A vaporizer crucible according to claim 7, and said guide means extending along substantially the entire length of said cooling duct.

9. A vaporizer crucible for vacuum vapor deposition apparatus, comprising: a metallic body having a recess accommodating vaporizing material; a cooling duct surrounding said recess at least partially and connected thermally-conductively to said metallic body; and guide means in said cooling duct imparting a swirling motion to cooling medium flowing in said cooling duct, said guide means comprising substantially spiral means matching the path of said cooling duct, said guide means extending along substantially the entire length of said cooling duct, said metallic body surrounding said recess comprising a flange and a dished portion connected to said flange, said cooling duct comprising a circular channel machined in said metallic body, said metallic body being inserted into a lower part of the crucible and closing off the circular channel, an annular cavity enclosed between said metallic body and lower part of the crucible, said cavity surrounding the lower end of said dished portion and having a diametral partition, a cooling medium supply pipe arranged on one side of said diametral partition, and a cooling discharge pipe arranged on another side of said diametral partition, said cavity being connected by uptake ducts to said cooling duct at a side of said cavity remote from said cooling medium supply and discharge pipes, and a further partition between said uptake ducts closing off said cooling duct, said spiral means having an open cross section in a zone of its longitudinal axis, said cross section having a diameter at least 25% of the outside diameter of said spiral means, said guide means comprising a helically coiled wire.

* * * * *